(12) United States Patent
Paek et al.

(10) Patent No.: US 7,790,584 B2
(45) Date of Patent: Sep. 7, 2010

(54) METHOD OF GROWING SEMI-POLAR NITRIDE SINGLE CRYSTAL THIN FILM AND METHOD OF MANUFACTURING NITRIDE SEMICONDUCTOR LIGHT EMITTING DIODE USING THE SAME

(75) Inventors: Ho Sun Paek, Gyunggi-do (KR); Jeong Wook Lee, Gyunggi-do (KR); Youn Joon Sung, Gyunggi-do (KR)

(73) Assignee: Samsung Led Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/246,594

(22) Filed: Oct. 7, 2008

(65) Prior Publication Data

US 2009/0155947 A1    Jun. 18, 2009

(30) Foreign Application Priority Data

Dec. 14, 2007    (KR) ...................... 10-2007-0131272

(51) Int. Cl.
    H01L 21/36    (2006.01)

(52) U.S. Cl. .......................... 438/507; 438/46; 438/47; 257/E21.097; 257/E21.099; 257/E21.117; 117/93; 117/101; 117/105

(58) Field of Classification Search ................. 438/481, 438/503, 507, 44, 46, 47; 257/E21.097, E21.099, 257/E21.108, E21.113, E21.117; 117/89, 117/93, 101, 102, 105
See application file for complete search history.

(56) References Cited

U.S. PATENT DOCUMENTS

| 6,153,010 A | * | 11/2000 | Kiyoku et al. | ................. 117/95 |
| 6,602,763 B2 | | 8/2003 | Davis et al. | |
| 7,220,324 B2 | * | 5/2007 | Baker et al. | ................... 148/33 |

OTHER PUBLICATIONS

Kappers, et al., "Growth and characterisation of semi-polar (11-22) InGaN/GaN MQW structures", Journal of Crystal Growth, 2007, pp. 330-338, vol. 30, pp. 155-159.*
Korean Office Action issued in Korean Patent Application No. 10-2007-0131272, mailed Jun. 26, 2009.

(Continued)

*Primary Examiner*—Julio J Maldonado
(74) *Attorney, Agent, or Firm*—McDermott Will & Emery LLP

(57) ABSTRACT

A method of growing a semi-polar nitride single crystal thin film. The method includes forming a semi-polar nitride single crystal base layer on an m-plane hexagonal system single crystal substrate, forming a dielectric pattern layer on the semi-polar nitride single crystal base layer, and growing the semi-polar nitride single crystal thin film on the semi-polar nitride single crystal base layer having the dielectric pattern layer in a lateral direction. The growing of the semi-polar nitride single crystal thin film in a lateral direction includes primarily growing the semi-polar nitride single crystal thin film in the lateral direction such that part of a growth plane on the semi-polar nitride single crystal base layer has an a-plane, and secondarily growing the semi-polar nitride single crystal thin film in the lateral direction such that sidewalls of the primarily grown semi-polar nitride single crystal thin film are combined to have a $(11\bar{2}2)$ plane.

25 Claims, 5 Drawing Sheets

OTHER PUBLICATIONS

Imer, B., et al., "Growth evolution in sidewall lateral epitaxial overgrowth (SLEO)", Journal of Crystal Growth, 2007, pp. 330-338, vol. 306, Elsevier B.V.

Kappers, M.J., et al., "Growth and characterization of semi-polar (1122) InGaN/GaN MQW structures", Journal of Crystal Growth, 2006, pp. 155-159, pp. 155-159, Elsevier B.V.

T.J. Baker et al., "Characterization of Planar Semipolar Gallium Nitride Films on Sapphire Substrates," Japanese Journal of Applied Physics, vol. 45, No. 6, 2006, pp. L154-L157.

Korean Office Action, w/ English translation thereof, issued in Korean Patent Application No. KR 10-2007-0131272 dated Dec. 31, 2009.

* cited by examiner

METHOD OF GROWING SEMI-POLAR NITRIDE SINGLE CRYSTAL THIN FILM AND METHOD OF MANUFACTURING NITRIDE SEMICONDUCTOR LIGHT EMITTING DIODE USING THE SAME

CROSS-REFERENCE TO RELATED APPLICATIONS

This application claims the priority of Korean Patent Application No. 2007-131272, filed on Dec. 14, 2007, in the Korean Intellectual Property Office, the disclosure of which is incorporated herein by reference.

BACKGROUND OF THE INVENTION

1. Field of the Invention

The present invention relates to a method of growing a semi-polar nitride single crystal thin film and a method of manufacturing a nitride semiconductor light emitting diode using the same.

2. Description of the Related Art

In general, when a nitride semiconductor light emitting diode is manufactured, most single crystal thin films of nitride such as gallium nitride have the c-plane, i.e. the (0001) plane, and can be grown on a c-plane hexagonal system single crystal substrate (e.g. a sapphire substrate) using metal organic chemical vapor deposition (MOCVD), molecular beam epitaxy (MBE), or hydride vapor phase epitaxy (HVPE).

In this manner, the c-plane nitride single crystal thin film shows polarity because a gallium layer and a nitrogen layer are repeatedly stacked along a c crystal axis. This induces an internal electric field. In this case, the internal electric field inside the light emitting diode is responsible for reduction in the recombination rate of electrons and holes, thereby lowering luminous efficiency of the light emitting diode. Piezoelectric polarization also occurs to decrease a luminous wavelength. Thus, it is difficult to realize the light emitting diode using a long wavelength element.

In order to solve this problem, a semi-polar nitride single crystal thin film must be grown. However, when the c-plane hexagonal system single crystal substrate is used, it is difficult to grow the nitride single crystal thin film into a semi-polar plane. Thus, technology of growing the semi-polar nitride single crystal thin film using a substrate with a non-polar plane is required.

Further, when the semi-polar nitride single crystal thin film is grown, crystal defects occur due to a lattice constant difference between the substrate and the semi-polar nitride single crystal thin film. These crystal defects induce non-radiative recombination in the event of the operation of the light emitting diode, thereby generating much heat. Thus, it is necessary to grow the semi-polar nitride single crystal thin film so as to minimize the crystal defects in order to improve light extraction efficiency.

SUMMARY OF THE INVENTION

An aspect of the present invention is to provide a method of growing a semi-polar nitride single crystal thin film, in which the semi-polar nitride single crystal thin film is grown twice on an m-plane hexagonal system single crystal substrate at different lateral growth rates in a lateral direction, thereby having a $(11\bar{2}2)$ plane and high crystallinity.

Another aspect of the present invention is to provide a method of manufacturing a nitride semiconductor light emitting diode, in which a light emitting structure is formed on a semi-polar nitride single crystal thin film, thereby improving luminous efficiency.

According to an aspect of the present invention, there is provided a method of growing a semi-polar nitride single crystal thin film, which includes the steps of forming a semi-polar nitride single crystal base layer on an m-plane hexagonal system single crystal substrate, forming a dielectric pattern layer on the semi-polar nitride single crystal base layer, and growing the semi-polar nitride single crystal thin film on the semi-polar nitride single crystal base layer having the dielectric pattern layer in a lateral direction. Here, the step of growing the semi-polar nitride single crystal thin film in a lateral direction includes the sub-steps of primarily growing the semi-polar nitride single crystal thin film in the lateral direction such that part of a growth plane on the semi-polar nitride single crystal base layer has an a-plane, and secondarily growing the semi-polar nitride single crystal thin film in the lateral direction such that sidewalls of the primarily grown semi-polar nitride single crystal thin film are combined to have a $(11\bar{2}2)$ plane.

In this case, the step of forming a dielectric pattern layer may include the sub-steps of growing a dielectric material on the semi-polar nitride single crystal base layer, and etching the dielectric material at predetermined intervals to form the dielectric pattern layer having stripe patterns in a $[1\bar{1}00]$ direction.

Each stripe pattern may have a width between about 2 μm and about 30 μm. The dielectric material may include one of silica $(SiO_2)$ and silicon nitride (SiN). The dielectric pattern layer may be formed at a thickness between about 1000 Å and about 4000 Å.

Meanwhile, the sub-step of primarily growing the semi-polar nitride single crystal thin film in the lateral direction may include primarily growing the semi-polar nitride single crystal thin film in the lateral direction at a first lateral growth rate using a first growth pressure, and the sub-step of secondarily growing the semi-polar nitride single crystal thin film in the lateral direction may include secondarily growing the semi-polar nitride single crystal thin film in the lateral direction at a second lateral growth rate using a second growth pressure higher than the first growth pressure.

The first growth pressure may range from about 30 torr to about 100 torr, and the second growth pressure may range from about 150 torr to about 300 torr.

Further, the sub-step of primarily growing the semi-polar nitride single crystal thin film in the lateral direction may include primarily growing the semi-polar nitride single crystal thin film in the lateral direction at a first lateral growth rate using a first growth temperature, and the sub-step of secondarily growing the semi-polar nitride single crystal thin film in the lateral direction may include secondarily growing the semi-polar nitride single crystal thin film in the lateral direction at a second lateral growth rate using a second growth temperature higher than the first growth temperature.

In this case, the first growth temperature may range from about 900° C. to about 1030° C., and the second growth temperature may range from about 1030° C. to about 1150° C.

Also, the sub-step of primarily growing the semi-polar nitride single crystal thin film in the lateral direction may include primarily growing the semi-polar nitride single crystal thin film in the lateral direction at a first lateral growth rate using a first ratio of group III to group V, and the sub-step of secondarily growing the semi-polar nitride single crystal thin film in the lateral direction may include secondarily growing the semi-polar nitride single crystal thin film in the lateral direction at a second lateral growth rate using a second ratio of group III to group V smaller than the first ratio of group III to group V.

In this case, the first lateral growth rate may range from about 2.0 μm/hr to about 3.0 μm/hr, and the second lateral growth rate may range from about 0.5 μm/hr to about 2.0 μm/hr.

Further, the step of growing the semi-polar nitride single crystal thin film in a lateral direction may be performed using one of epitaxial lateral over growth (ELOG) and Pendeo epitaxial growth.

According to another aspect of the present invention, there is provided a method of manufacturing a nitride semiconductor light emitting diode, which includes the steps of forming a semi-polar nitride single crystal base layer on an m-plane hexagonal system single crystal substrate, forming a dielectric pattern layer on the semi-polar nitride single crystal base layer, growing the semi-polar nitride single crystal thin film on the semi-polar nitride single crystal base layer having the dielectric pattern layer in a lateral direction, and forming a light emitting structure including a first nitride semiconductor layer, an active layer and a second nitride semiconductor layer on the semi-polar nitride single crystal thin film. Here, the step of growing the semi-polar nitride single crystal thin film in a lateral direction includes sub-steps of primarily growing the semi-polar nitride single crystal thin film in the lateral direction such that part of a growth plane on the semi-polar nitride single crystal base layer has an a-plane, and secondarily growing the semi-polar nitride single crystal thin film in the lateral direction such that sidewalls of the primarily grown semi-polar nitride single crystal thin film are combined to have a (11$\bar{2}$2) plane.

Further, the step of forming a dielectric pattern layer may include the sub-steps of growing a dielectric material on the semi-polar nitride single crystal base layer, and etching the dielectric material at predetermined intervals to form the dielectric pattern layer having stripe patterns in a [1$\bar{1}$00] direction.

Each stripe pattern may have a width between about 2 μm and about 30 μm. The dielectric material may include one of silica ($SiO_2$) and silicon nitride (SiN). The dielectric pattern layer may be formed at a thickness between about 1000 Å and about 4000 Å.

Meanwhile, the sub-step of primarily growing the semi-polar nitride single crystal thin film in the lateral direction may include primarily growing the semi-polar nitride single crystal thin film in the lateral direction at a first lateral growth rate using a first growth pressure, and the sub-step of secondarily growing the semi-polar nitride single crystal thin film in the lateral direction may include secondarily growing the semi-polar nitride single crystal thin film in the lateral direction at a second lateral growth rate using a second growth pressure higher than the first growth pressure.

The first growth pressure may range from about 30 torr to about 100 torr, and the second growth pressure may range from about 150 torr to about 300 torr.

Further, the sub-step of primarily growing the semi-polar nitride single crystal thin film in the lateral direction may include primarily growing the semi-polar nitride single crystal thin film in the lateral direction at a first lateral growth rate using a first growth temperature, and the sub-step of secondarily growing the semi-polar nitride single crystal thin film in the lateral direction may include secondarily growing the semi-polar nitride single crystal thin film in the lateral direction at a second lateral growth rate using a second growth temperature higher than the first growth temperature.

In this case, the first growth temperature may range from about 900° C. to about 1030° C., and the second growth temperature may range from about 1030° C. to about 1150° C.

Also, the sub-step of primarily growing the semi-polar nitride single crystal thin film in the lateral direction may include primarily growing the semi-polar nitride single crystal thin film in the lateral direction at a first lateral growth rate using a first ratio of group III to group V, and the sub-step of secondarily growing the semi-polar nitride single crystal thin film in the lateral direction may include secondarily growing the semi-polar nitride single crystal thin film in the lateral direction at a second lateral growth rate using a second ratio of group III to group V smaller than the first ratio of group III to group V.

In this case, the first lateral growth rate may range from about 2.0 μm/hr to about 3.0 μm/hr, and the second lateral growth rate may range from about 0.5 μm/hr to about 2.0 μm/hr.

Further, the step of growing the semi-polar nitride single crystal thin film in a lateral direction may be performed using one of epitaxial lateral over growth (ELOG) and Pendeo epitaxial growth.

In addition, the method of manufacturing a nitride semiconductor light emitting diode may further include the steps of etching part of the light emitting structure to expose the first nitride semiconductor layer, and forming a first electrode at a position where the first nitride semiconductor layer is exposed, and a second electrode on a second nitride semiconductor layer.

According to the present invention, the semi-polar nitride single crystal thin film is grown twice on the m-plane hexagonal system single crystal substrate at different lateral growth rates in a lateral direction, thereby having the (11$\bar{2}$2) plane and the high crystallinity.

Further, when the light emitting diode is manufactured, the light emitting structure is formed on this nitride single crystal thin film, so that the nitride single crystal thin film prevents an internal electric field from being generated, and increases a recombination rate of electrons and holes which are required to emit light. Thus, the luminous efficiency of the light emitting diode can be improved, and the light can be emitted with a longer wavelength, so that the reliability of the light emitting diode can be improved.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EXEMPLARY EMBODIMENTS

Exemplary embodiments of the present invention will now be described in greater detail with reference to the accompanying drawings.

Figure 1A:
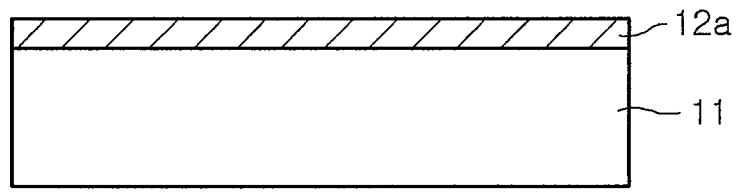
FIGS. 1A through 1D are process diagrams for explaining a method of growing a nitride single crystal thin film according to an embodiment of the present invention.

FIGS. 1A through 1D are process diagrams for explaining a method of growing a nitride single crystal thin film according to an embodiment of the present invention. Referring to FIG. 1A, a semi-polar nitride single crystal base layer 12a is deposited on an m-plane hexagonal system single crystal substrate 11. Here, the hexagonal system single crystal substrate 11 is a sapphire substrate. Thus, the semi-polar nitride single crystal base layer 12a can be formed by applying gallium nitride (GaN) to the m-plane sapphire substrate using organic chemical deposition. The semi-polar nitride single crystal base layer 12a can be deposited at a thickness between about 2 μm and about 3 μm.

Figure 1B:
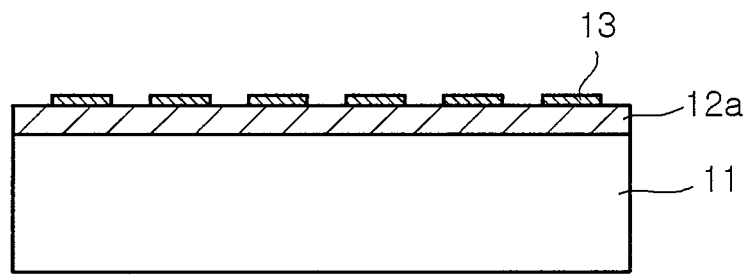

Next, as illustrated in FIG. 1B, a dielectric pattern layer 13 is formed on the semi-polar nitride single crystal base layer 12a. Specifically, the dielectric material such as silica ($SiO_2$) or silicon nitride (SiN) is deposited on the semi-polar nitride single crystal base layer 12a, and then is subjected to wet or dry etching at predetermined intervals, so that stripe patterns can be formed in a [1$\bar{1}$00] direction. In this case, the dielectric pattern layer 13 can be formed at intervals between about 2 μm and about 6 μm, and have a width between about 2 μm and about 30 μm. The dielectric pattern layer 13 can be formed at a thickness between about 1000 Å and about 4000 Å.

Meanwhile, the semi-polar nitride single crystal base layer 12a is exposed on the remaining etch region other than a region where the dielectric pattern layer 13 is formed. This etch region is a sort of window region, and serves to induce re-growth of the semi-polar nitride single crystal base layer 12a.

Figure 1C:
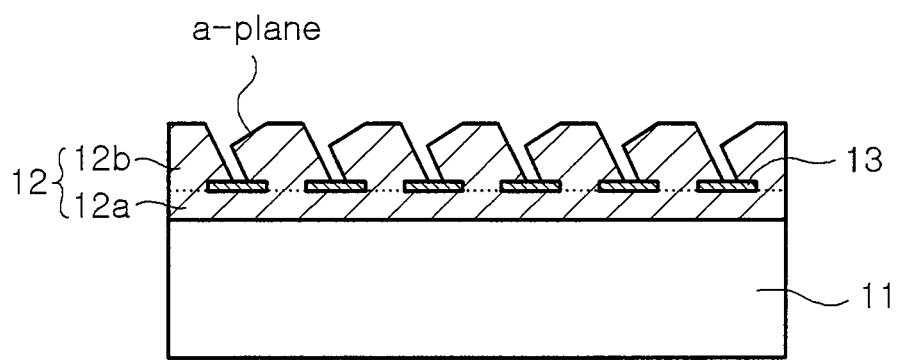

Afterwards, referring to FIG. 1C, the semi-polar nitride single crystal base layer 12a, on which the dielectric pattern layer 13 is formed, is grown again such that part of its growth plane has an a-plane. To this end, a semi-polar nitride single crystal growth layer 12b is primarily grown in a lateral direction at a first lateral growth rate. In this case, the first lateral growth rate refers to the growth rate at which the semi-polar nitride single crystal growth layer 12b is primarily grown in the lateral direction, and ranges from about 2.0 μm/hr to about 3.0 μm/hr.

Further, the first lateral growth rate, at which the semi-polar nitride single crystal growth layer 12b, part of the grown plane of which has the a-plane by means of the first lateral growth, is formed, can be controlled using any one of a first growth pressure, a first growth temperature, and a first ratio of group III to group V. In this case, the first growth pressure can range from about 30 torr to about 100 torr, and the first growth temperature can range from about 900° C. to about 1030° C. Further, the first ratio of group III to group V can be applied by decreasing a flow rate of tri-methyl gallium (TMG). In this manner, the first lateral growth rate is controlled using the first growth pressure, the first growth temperature, and the first ratio of group III to group V, so that the semi-polar nitride single crystal growth layer 12b can be primarily grown in the lateral direction.

When the semi-polar nitride single crystal growth layer 12b is grown at the first lateral growth rate, the first lateral growth rate thereof can be faster than a vertical growth rate thereof. Further, the semi-polar nitride single crystal growth layer 12b has three growth planes of a-plane, c-plane, and m-plane. The a-plane, one of the growth planes, can have the growth rate faster than those of the c-plane and the m-plane. Thus, as illustrated in FIG. 1C, the semi-polar nitride single crystal growth layer 12b, which is grown on a window region between patterns of the dielectric pattern layer 13, has the a-plane. Thus it can be found that a spacing between sidewalls of the patterns of the semi-polar nitride single crystal growth layer 12b becomes narrower due to the first lateral growth rate.

Figure 1D:
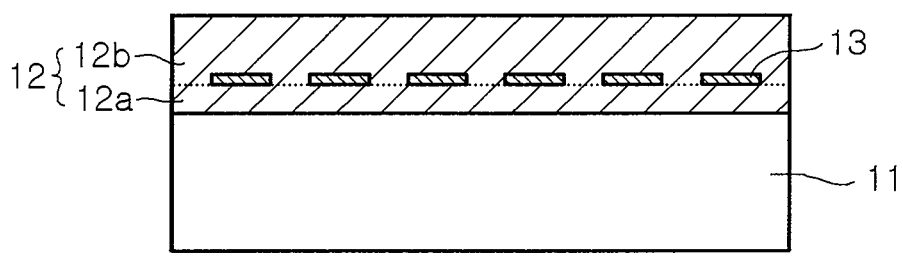

Next, as illustrated in FIG. 1D, the semi-polar nitride single crystal growth layer 12b, which have been subjected to the first lateral growth as illustrated in FIG. 1C, are secondarily grown in a lateral direction at a second lateral growth rate such that their sidewalls are combined to have a (11$\bar{2}$2) plane. In this case, the second lateral growth rate refers to the growth rate at which the semi-polar nitride single crystal growth layer 12b is secondarily grown in the lateral direction, and ranges from about 0.5 μm/hr to about 2.0 μm/hr. The second lateral growth rate is slower than the first lateral growth rate at which the semi-polar nitride single crystal growth layer 12b is primarily grown in the lateral direction.

Meanwhile, when the semi-polar nitride single crystal growth layer 12b is primarily grown in the lateral direction as illustrated in FIG. 1C, the lateral growth rate is faster than the vertical growth rate, the semi-polar nitride single crystal growth layer 12b can be combined with each other. However, part of each semi-polar nitride single crystal growth layer 12b has the a-plane as the growth plane, so that it is difficult to form the semi-polar nitride single crystal growth layer 12b so as to have the (11$\bar{2}$2) plane parallel to the m-plane hexagonal system single crystal substrate 11. Thus, the semi-polar nitride single crystal growth layer 12b is secondarily grown in the lateral direction at the second lateral growth rate, so that it can be formed so as to have the (11$\bar{2}$2) plane parallel to the m-plane hexagonal system single crystal substrate 11. In this manner, the second lateral growth rate for forming the semi-polar nitride single crystal growth layer 12b having the (11$\bar{2}$2) plane can be controlled using any one of a second growth pressure, a second growth temperature, and a second ratio of group III to group V. In this case, the second growth pressure can be higher than the first growth pressure, and range from about 150 torr to about 300 torr. The second growth temperature can be higher than the first growth temperature, and range from about 1030° C. to about 1150° C. Further, the second ratio of group III to group V can be applied by increasing a flow rate of tri-methyl gallium (TMG), compared to the first ratio of group III to group V. In this manner, the second lateral growth rate is controlled using the second growth pressure, the second growth temperature, and the second ratio of group III to group V, so that the semi-polar nitride single crystal growth layer 12b having the (11$\bar{2}$2) plane can be formed.

As for the semi-polar nitride single crystal growth layer 12b, its vertical growth rate is faster than its second lateral growth rate. Thus, as illustrated in FIG. 1C, the semi-polar nitride single crystal growth layer 12b, which have been subjected to the first lateral growth, grows to combine their sidewalls, and then continues to rapidly grow in a vertical direction, so that the semi-polar nitride single crystal growth layer 12b having the (11$\bar{2}$2) plane parallel to the m-plane hexagonal system single crystal substrate 11 can be formed.

The semi-polar nitride single crystal growth layer 12b, which has been formed by the processes of FIGS. 1C and 1D, can have a thickness between about 10 μm and about 12 μm. Thus, the nitride single crystal thin film 12 including the semi-polar nitride single crystal base layer 12a and the semi-polar nitride single crystal growth layer 12b can be formed at an overall thickness between about 12 µm and about 15 µm.

When the present invention has been described with reference to FIGS. 1C and 1D, the first and second growth pressures, the first and second growth temperatures, etc. have been defined by specific numerical values. These numerical values are not limited to those disclosed herein, but they can be varied according to deposition equipment and environment.

Meanwhile, the semi-polar nitride single crystal growth layer 12b as illustrated in FIGS. 1C and 1D has been described to be grown twice in the lateral direction using an epitaxial lateral over growth (ELOG). Alternatively, the semi-polar nitride single crystal growth layer 12b may be grown in the lateral direction using Pendeo epitaxial growth. More specifically, in the process of FIG. 1B, when the dielectric material is etched, the semi-polar nitride single crystal base layer 12a on the region other than the region where the dielectric pattern layer 13 will be formed can be removed at the same time. Thus, the m-plane hexagonal system single crystal substrate 11 can be exposed between the patterns of the dielectric pattern layer 13. Then, as described above, the semi-polar nitride single crystal growth layer 12b are subjected to the first growth using the first lateral growth rate, and then to the second growth using the second lateral growth rate, so that the semi-polar nitride single crystal growth layer 12b, the sidewalls of which have been combined, can be formed as illustrated in FIG. 1D.

Figure 2A:
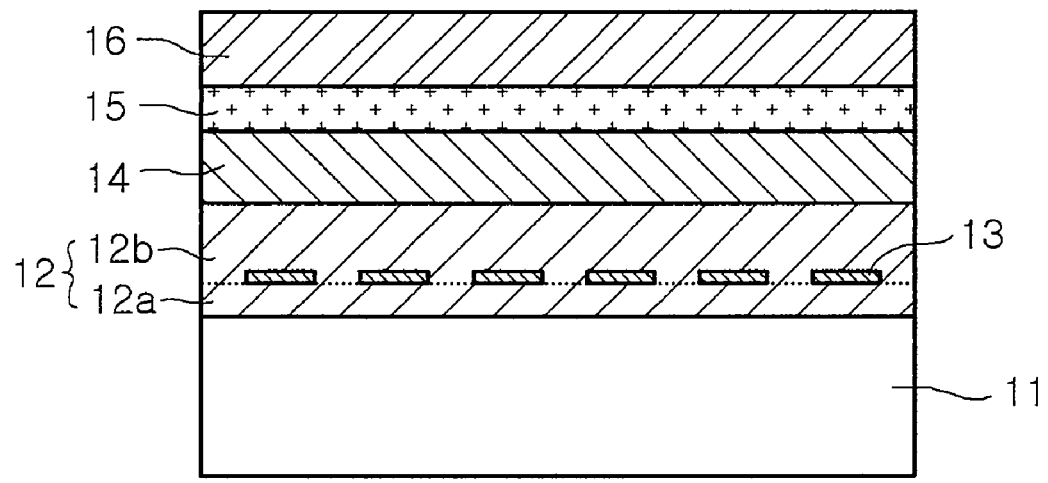
FIGS. 2A and 2B are process diagrams for explaining a method of manufacturing a nitride semiconductor light emitting diode according to an embodiment of the present invention.
Figure 2B:
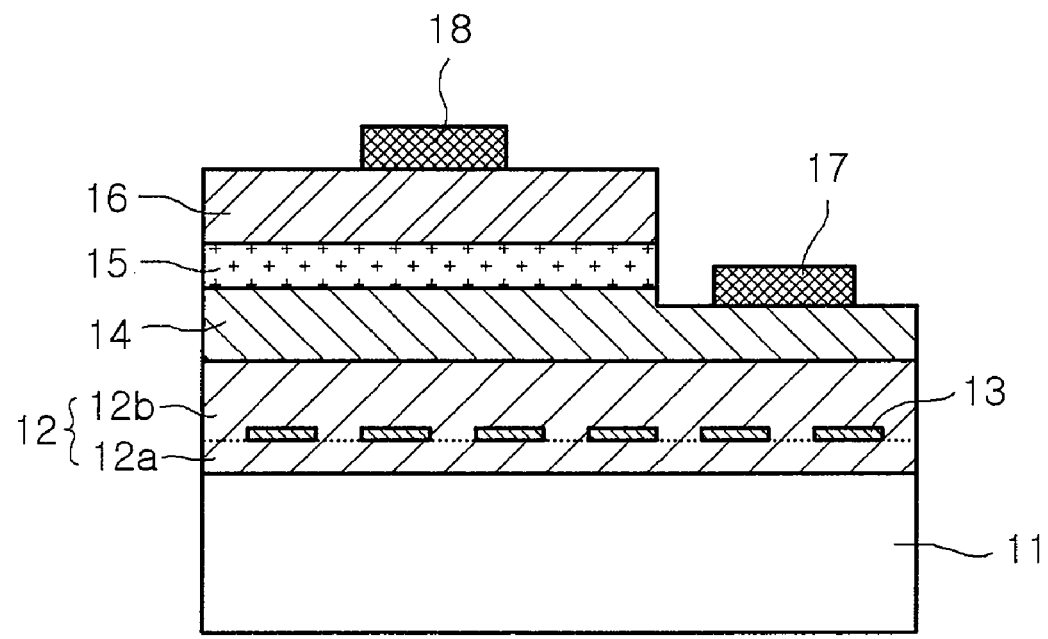

FIGS. 2A and 2B are process diagrams for explaining a method of manufacturing a nitride semiconductor light emitting diode according to an embodiment of the present invention.

The nitride semiconductor light emitting diode of the present invention can be manufactured on the nitride single crystal thin film 12 grown through the processes of FIGS. 1A through 1D. More specifically, referring to FIG. 2A, a light emitting structure including a first nitride semiconductor layer 14, an active layer 15, and a second nitride semiconductor layer 16 is formed on the substrate 11 illustrated in FIG. 1D. Here, the first nitride semiconductor layer 14 can be formed by doping n-type dopants such as silicon (Si), indium (In), tin (Sn) or the like into a semiconductor material such as GaN. The active layer 15 can be formed so as to have a single or multiple quantum well structure using a GaN based material such as GaN or InGaN. The second nitride semiconductor layer 16 can be formed by doping p-type dopants such as zinc (Zn), cadmium (Cd), magnesium (Mg) or the like into a semiconductor material such as GaN. In this case, the first nitride semiconductor layer 14, the active layer 15, and the second nitride semiconductor layer 16 can be formed using deposition such as metal organic chemical vapor deposition (MOCVD) or molecular beam epitaxy (MBE).

Thereafter, as illustrated in FIG. 2B, part of the light emitting structure is etched to expose the first nitride semiconductor layer 14. A first electrode 17 is formed on the exposed first nitride semiconductor layer 14. A second electrode 18 is formed on the top of the light emitting structure, i.e. on the second nitride semiconductor layer 16. In this case, the first electrode 17 can be an n-electrode, while the second electrode 18 can be a p-electrode.

In this manner, when the light emitting diode is manufactured on the nitride single crystal thin film 12 of the present invention, the crystal defects of the nitride single crystal thin film 12 are reduced, so that the performance of the light emitting structure can be improved. Further, the nitride single crystal thin film 12 has a semi-polar characteristic, and thus decrease the generation of the internal electric field to thereby increase the recombination rate of electrons and holes, so that the luminous efficiency of the light emitting diode can be improved.

Figure 3:
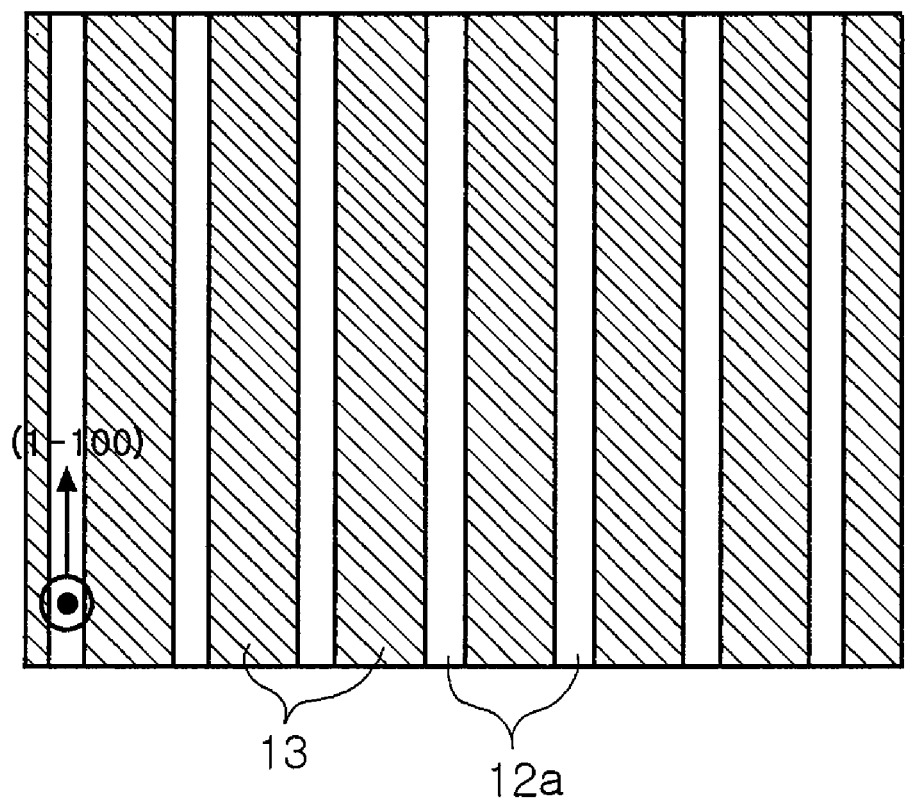
FIG. 3 is a top plan view illustrating a dielectric pattern layer on which an m-plane hexagonal system single crystal substrate.

FIG. 3 is a top plan view illustrating a dielectric pattern layer on which an m-plane hexagonal system single crystal substrate. It can be seen from FIG. 3 that the dielectric pattern layer 13 is formed on the top of the m-plane hexagonal system single crystal substrate 11 illustrated in FIG. 1B, and that the semi-polar nitride single crystal base layer 12a is exposed between the patterns of the dielectric pattern layer 13. In this case, the dielectric pattern layer 13 can be formed with a width between about 2 µm and about 30 µm in a direction. Further, the gap between the patterns of the dielectric pattern layer 13, i.e. the region where the semi-polar nitride single crystal base layer 12a is exposed can have a width between about 2 µm and about 6 µm. The semi-polar nitride single crystal base layer 12a is induced to grow again from the gap between the patterns of the dielectric pattern layer 13, thereby forming the semi-polar nitride single crystal growth layer 12b.

Figure 4A:
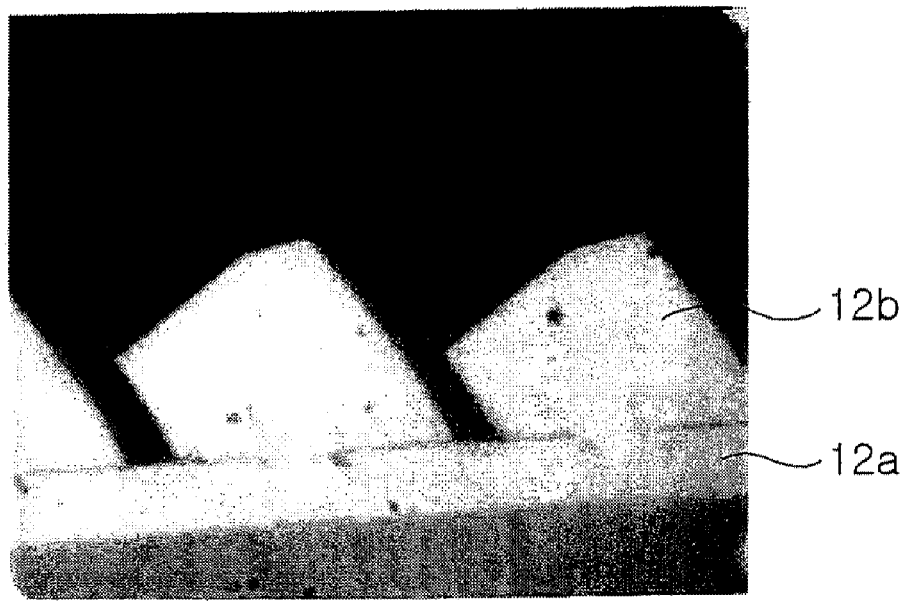
FIGS. 4A through 4C are optical microscope (OM) photographs showing the growth structure of each semi-polar nitride single crystal thin film depending on a lateral growth rate.
Figure 4B:
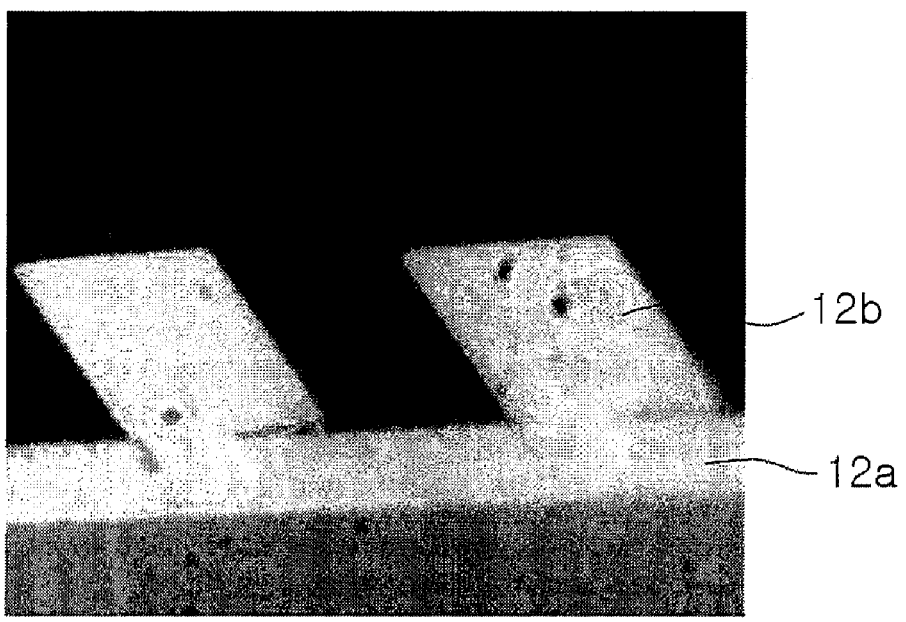
Figure 4C:
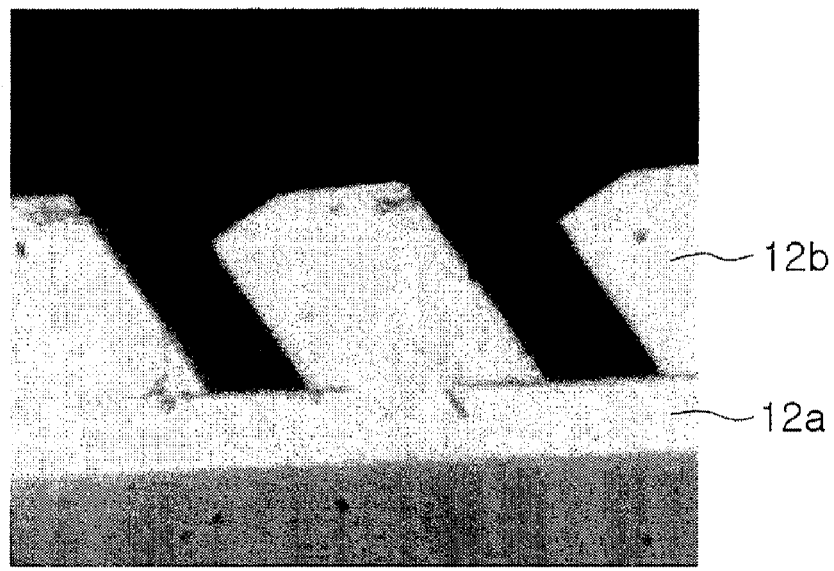

FIGS. 4A through 4C are optical microscope (OM) photographs showing the growth structure of each semi-polar nitride single crystal thin film depending on a lateral growth rate. In the OM photograph of FIG. 4A, the semi-polar nitride single crystal growth layer 12b is grown at a first lateral growth rate alone. To this end, the semi-polar nitride single crystal growth layer 12b is grown in a lateral direction at the first lateral growth rate using a first growth pressure of about 50 torr. In this case, the semi-polar nitride single crystal growth layer 12b has the first lateral growth rate faster than its vertical grown rate, and an a-plane growth rate faster than c-plane and m-plane growth rates. As such, in the case where a growth time of the semi-polar nitride single crystal growth layer 12b is increased, it is possible to combine the sidewalls of the patterns of the semi-polar nitride single crystal growth layer 12b. However, the growth plane of the semi-polar nitride single crystal growth layer 12b is not formed as the (11$\overline{2}$2) plane, so that the light emitting diode cannot be manufactured.

The semi-polar nitride single crystal growth layer 12b shown in FIG. 4A can show the identical growth structure when the first growth temperature or the first ratio of group III to group V is used.

Further, in the OM photograph of FIG. 4B, the semi-polar nitride single crystal growth layer 12b is grown at a second lateral growth rate alone. To this end, the semi-polar nitride single crystal growth layer 12b is grown at the second lateral growth rate in a lateral direction using a first growth pressure of about 300 torr. In this case, the semi-polar nitride single crystal growth layer 12b has the second lateral growth rate slower than its vertical grown rate, so that the growth plane thereof is grown in a vertical direction. Thus, the semi-polar nitride single crystal growth layer 12b can be formed so as to have the (11$\overline{2}$2) plane parallel to the m-plane hexagonal system single crystal substrate 11. However, since the lateral growth rate of the semi-polar nitride single crystal growth layer 12b is slow, it is difficult to combine the sidewalls of the patterns of the semi-polar nitride single crystal growth layer 12b.

Further, although the semi-polar nitride single crystal growth layer 12b is laterally grown under the pressure of 300 torr to thereby result in combination of the sidewalls thereof, a process time becomes very long, and furthermore the semi-polar nitride single crystal growth layer 12b becomes very thick. As such, it is difficult to manufacture the light emitting diode. Thus, it is difficult to grow the semi-polar nitride single crystal growth layer 12b having high crystallinity on the m-plane hexagonal system single crystal substrate 11 using the second lateral growth rate alone.

The semi-polar nitride single crystal growth layer 12b shown in FIG. 4B can show the identical growth structure when the second growth temperature or the second ratio of group III to group V is used.

Further, in the OM photograph of FIG. 4C, the semi-polar nitride single crystal growth layer 12b is grown at a third lateral growth rate alone. To this end, the semi-polar nitride single crystal growth layer 12b is grown at the third lateral growth rate in a lateral direction using a third growth pressure of about 120 torr. In this case, the embodiment of FIG. 4C has a slower third lateral growth rate compared to the embodiment of FIG. 4A using the first lateral growth rate, and poorer flatness compared to the embodiment of FIG. 4B using the second lateral growth rate. Thus, it is also difficult to form the semi-polar nitride single crystal growth layer 12b shown in FIG. 4C so as not only to be parallel to the m-plane hexagonal system single crystal substrate 11 but also have high crystallinity.

In the present invention, the semi-polar nitride single crystal growth layer 12b is primarily grown in the lateral direction using the first lateral growth rate as shown in FIG. 4A, and are secondarily grown in the lateral direction using the second lateral growth rate as shown in FIG. 4B, so that they have the $(11\bar{2}2)$ plane parallel to the m-plane hexagonal system single crystal substrate 11 and the high crystallinity. Thus, a detailed description thereof will be made below.

Figure 5:
FIG. 5 is an OM photograph showing the growth structure of each semi-polar nitride single crystal thin film subjected to second growth according to an embodiment of the present invention.

FIG. 5 is an OM photograph showing the growth structure of each semi-polar nitride single crystal thin film subjected to second growth according to an embodiment of the present invention. The semi-polar nitride single crystal growth layer 12b shown in FIG. 5 is primarily grown in a lateral direction at a first lateral growth rate, and then is secondarily grown in the lateral direction at a second lateral growth rate. In this case, as shown in FIG. 4A, the semi-polar nitride single crystal thin film has the first lateral growth rate faster than the vertical growth rate, but has uneven growth plane because part of its growth plane has an a-plane. Thus, the semi-polar nitride single crystal growth layer 12b is subjected to the first growth at the first lateral growth rate, and then the second growth at the second lateral growth rate. In this case, when being secondarily grown in the lateral direction, the semi-polar nitride single crystal thin film has the second lateral growth rate slower than its vertical growth rate. Thus, the region, which has grown in the growing direction of an a-plane, is rapidly grown in a vertical direction, thereby having a flat plane. The sidewalls of the semi-polar nitride single crystal thin film 12 are gradually grown and combined. As a result, the semi-polar nitride single crystal thin film 12 is grown to have the $(11\bar{2}2)$ plane parallel to the m-plane hexagonal system single crystal substrate 11 and the high crystallinity. In the case where the light emitting structure is manufactured on this nitride single crystal thin film 12, the semi-polar characteristic of the nitride single crystal thin film 12 prevents the internal electric field from being generated, thereby increasing the recombination rate of electrons and holes which are required to emit light. Thus, the luminous efficiency of the light emitting diode can be improved.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of growing a nitride single crystal thin film, comprising:
    forming a semi-polar nitride single crystal base layer on an m-plane hexagonal system single crystal substrate;
    forming a dielectric pattern layer on the semi-polar nitride single crystal base layer; and
    growing the semi-polar nitride single crystal thin film on the semi-polar nitride single crystal base layer having the dielectric pattern layer in a lateral direction,
    wherein the growing of the semi-polar nitride single crystal thin film in a lateral direction includes:
    primarily growing the semi-polar nitride single crystal thin film in the lateral direction such that part of a growth plane on the semi-polar nitride single crystal base layer has an a-plane; and
    secondarily growing the semi-polar nitride single crystal thin film in the lateral direction such that sidewalls of the primarily grown semi-polar nitride single crystal thin film are combined to have a $(11\bar{2}2)$ plane.

2. The method of claim 1, wherein the forming of a dielectric pattern layer includes:
    growing a dielectric material on the semi-polar nitride single crystal base layer; and
    etching the dielectric material at predetermined intervals to form the dielectric pattern layer having stripe patterns in a $[1\bar{1}00]$ direction.

3. The method of claim 2, wherein each stripe pattern has a width between about 2 μm and about 30 μm.

4. The method of claim 2, wherein the dielectric material includes one of silica ($SiO_2$) and silicon nitride (SiN).

5. The method of claim 2, wherein the dielectric pattern layer is formed at a thickness between about 1000 Å and about 4000 Å.

6. The method of claim 1, wherein:
    the primarily growing of the semi-polar nitride single crystal thin film in the lateral direction includes primarily growing the semi-polar nitride single crystal thin film in the lateral direction at a first lateral growth rate using a first growth pressure; and
    the secondarily growing of the semi-polar nitride single crystal thin film in the lateral direction includes secondarily growing the semi-polar nitride single crystal thin film in the lateral direction at a second lateral growth rate using a second growth pressure higher than the first growth pressure.

7. The method of claim 6, wherein the first growth pressure ranges from about 30 torr to about 100 torr, and the second growth pressure ranges from about 150 torr to about 300 torr.

8. The method of claim 1, wherein:
    the primarily growing of the semi-polar nitride single crystal thin film in the lateral direction includes primarily growing growth temperature; and
    the secondarily growing of the semi-polar nitride single crystal thin film in the lateral direction includes secondarily growing the semi-polar nitride single crystal thin film in the lateral direction at a second lateral growth rate using a second growth temperature higher than the first growth temperature.

9. The method of claim 8, wherein the first growth temperature ranges from about 900° C. to about 1030° C., and the second growth temperature ranges from about 1030° C. to about 1150° C.

10. The method of claim 1, wherein:
    the primarily growing of the semi-polar nitride single crystal thin film in the lateral direction includes primarily growing the semi-polar nitride single crystal thin film in the lateral direction at a first lateral growth rate using a first ratio of group III to group V; and the secondarily growing of the semi-polar nitride single crystal thin film in the lateral direction includes secondarily growing the semi-polar nitride single crystal thin film in the lateral direction at a second lateral growth rate using a second ratio of group III to group V smaller than the first ratio of group III to group V.

11. The method of claim 10, wherein the first lateral growth rate ranges from about 2.0 µm/hr to about 3.0 µm/hr, and the second lateral growth rate ranges from about 0.5 µm/hr to about 2.0 µm/hr.

12. The method of claim 1, wherein the growing of the semi-polar nitride single crystal thin film in a lateral direction is performed using one of epitaxial lateral over growth (ELOG) and Pendeo epitaxial growth.

13. A method of manufacturing a nitride semiconductor light emitting diode, comprising:

forming a semi-polar nitride single crystal base layer on an m-plane hexagonal system single crystal substrate;

forming a dielectric pattern layer on the semi-polar nitride single crystal base layer;

growing the semi-polar nitride single crystal thin film on the semi-polar nitride single crystal base layer having the dielectric pattern layer in a lateral direction; and forming a light emitting structure including a first nitride semiconductor layer, an active layer and a second nitride semiconductor layer on the semi-polar nitride single crystal thin film, wherein the growing of the semi-polar nitride single crystal thin film in a lateral direction includes:

primarily growing the semi-polar nitride single crystal thin film in the lateral direction such that part of a growth plane on the semi-polar nitride single crystal base layer has an a-plane; and secondarily growing the semi-polar nitride single crystal thin film in the lateral direction such that sidewalls of the primarily grown semi-polar nitride single crystal thin film are combined to have a (11$\bar{2}$2) plane.

14. The method of claim 13, wherein the forming of a dielectric pattern layer includes:

growing a dielectric material on the semi-polar nitride single crystal base layer; and etching the dielectric material at predetermined intervals to form the dielectric pattern layer having stripe patterns in a [1$\bar{1}$00] direction.

15. The method of claim 14, wherein each stripe pattern has a width between about 2 µm and about 30 µm.

16. The method of claim 14, wherein the dielectric material includes one of silica ($SiO_2$) and silicon nitride (SiN).

17. The method of claim 14, wherein the dielectric pattern layer is formed at a thickness between about 1000 Å and about 4000 Å.

18. The method of claim 13, wherein:

the primarily growing of the semi-polar nitride single crystal thin film in the lateral direction includes primarily growing the semi-polar nitride single crystal thin film in the lateral direction at a first lateral growth rate using a first growth pressure; and the secondarily growing of the semi-polar nitride single crystal thin film in the lateral direction includes secondarily growing the semi-polar nitride single crystal thin film in the lateral direction at a second lateral growth rate using a second growth pressure higher than the first growth pressure.

19. The method of claim 18, wherein the first growth pressure ranges from about 30 torr to about 100 torr, and the second growth pressure ranges from about 150 torr to about 300 torr.

20. The method of claim 13, wherein:

the primarily growing of the semi-polar nitride single crystal thin film in the lateral direction includes primarily growing the semi-polar nitride single crystal thin film in the lateral direction at a first lateral growth rate using a first growth temperature; and the secondarily growing of the semi-polar nitride single crystal thin film in the lateral direction includes secondarily growing the semi-polar nitride single crystal thin film in the lateral direction at a second lateral growth rate using a second growth temperature higher than the first growth temperature.

21. The method of claim 20, wherein the first growth temperature ranges from about 900° C. to about 1030° C., and the second growth temperature ranges from about 1030° C. to about 1150° C.

22. The method of claim 13, wherein:

the primarily growing of the semi-polar nitride single crystal thin film in the lateral direction includes primarily growing the semi-polar nitride single crystal thin film in the lateral direction at a first lateral growth rate using a first ratio of group III to group V; and the secondarily growing of the semi-polar nitride single crystal thin film in the lateral direction includes secondarily growing the semi-polar nitride single crystal thin film in the lateral direction at a second lateral growth rate using a second ratio of group III to group V smaller than the first ratio of group III to group V.

23. The method of one of claim 18, wherein the first lateral growth rate ranges from about 2.0 µm/hr to about 3.0 µm/hr, and the second lateral growth rate ranges from about 0.5 µm/hr to about 2.0 µm/hr.

24. The method of claim 13, wherein the growing of the semi-polar nitride single crystal thin film in a lateral direction is performed using one of epitaxial lateral over growth (ELOG) and Pendeo epitaxial growth.

25. The method of claim 13, further comprising:

etching part of the light emitting structure to expose the first nitride semiconductor layer; and forming a first electrode at a position where the first nitride semiconductor layer is exposed, and a second electrode on a second nitride semiconductor layer.

* * * * *